(12) United States Patent
Hikita et al.

(10) Patent No.: US 7,291,872 B2
(45) Date of Patent: Nov. 6, 2007

(54) SEMICONDUCTOR DEVICE AND METHOD FOR FABRICATING THE SAME

(75) Inventors: Masahiro Hikita, Hyogo (JP); Hiroaki Ueno, Osaka (JP); Yutaka Hirose, Kyoto (JP); Manabu Yanagihara, Osaka (JP); Yasuhiro Uemoto, Shiga (JP); Tsuyoshi Tanaka, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 114 days.

(21) Appl. No.: 11/193,417

(22) Filed: Aug. 1, 2005

(65) Prior Publication Data

US 2006/0060895 A1 Mar. 23, 2006

(30) Foreign Application Priority Data

Sep. 17, 2004 (JP) ............... 2004-270925

(51) Int. Cl.
*H01L 31/00* (2006.01)
(52) U.S. Cl. ...................... 257/192; 257/194
(58) Field of Classification Search ............... 257/192, 257/194, 280, 488
See application file for complete search history.

(56) References Cited

U.S. PATENT DOCUMENTS 5,329,154 A * 7/1994 Kishita et al. ............... 257/532
6,620,663 B1 9/2003 Sune
2005/0274977 A1* 12/2005 Saito et al. .................. 257/192

FOREIGN PATENT DOCUMENTS

| JP | 11-045892 | 2/1999 |
|---|---|---|
| JP | 2002-536847 | 10/2002 |
| WO | WO 00/48248 | 8/2000 |
| WO | WO 2004/068590 | 8/2004 |

OTHER PUBLICATIONS

Fukuda et al., "GaAs Field-Effect Transistors", The IEICE, 1992 pp. 213-215.
Ando et al. "Characterization of High Breakdown Voltage AlGaN/GaN Heterojunction FETs with a Field Plate Gate", Technical Report of IEICE, ED2002-214, CMP 2002-105 (Oct. 2002) pp. 29-34.
Saito W et al "600V AlGaN/GaN Power-HEMT: Design, Fabrication and Demonstration on High Voltage DC—DC Converter" IEEE US Dec. 8, 2003, pp. 587-590.
Thompson R et al "Performance of the ALGAN HEMT Structure With A Gate Extension" IEEE Transactions on Electron Devicees, IEEE Service Center, Piscataway, NJ, US<vol. 51, No. 2, Feb. 2004.

* cited by examiner

*Primary Examiner*—Mark V. Prenty
(74) *Attorney, Agent, or Firm*—McDermott Will & Emery LLP (57) ABSTRACT

In the structure of a semiconductor device of the present invention, a first source electrode is connected to a conductive substrate through a via hole, and a second source electrode is formed. Thus, even if a high reverse voltage is applied between a gate electrode and a drain electrode, electric field concentration likely to occur at an edge of the gate electrode closer to the drain electrode can be effectively dispersed or relaxed. Moreover, the conductive substrate is used as a substrate for forming element formation layers, so that a via hole penetrating the substrate to reach the backside thereof does not have to be formed in the conductive substrate. Thus, with the strength necessary for the conductive substrate maintained, the first source electrode can be electrically connected to a backside electrode.

14 Claims, 5 Drawing Sheets

SEMICONDUCTOR DEVICE AND METHOD FOR FABRICATING THE SAME

CROSS-REFERENCE TO RELATED APPLICATIONS

This application claims priority under 35 U.S.C. § 119 on Patent Application No. 2004-270925 filed in Japan on Sep. 17, 2004, the entire contents of which are hereby incorporated by reference.

BACKGROUND OF THE INVENTION (a) Fields of the Invention

The present invention relates to semiconductor devices made of III-V nitride semiconductor. In particular, the present invention relates to field effect semiconductor devices having high breakdown voltage and to methods for fabricating such a device.

(b) Description of Related Art

III-V nitride semiconductors, that is, mixed crystals represented by the general formula $Al_xGa_{1-x-y}In_yN$ (where $0 \leq x \leq 1$, $0 \leq y \leq 1$) such as gallium nitride (GaN), aluminum nitride (AlN), and indium nitride have, as physical characteristics, wide band gaps and direct transition type band structures. Owing to these characteristics, consideration is being taken of application of the III-V nitride semiconductors not only to short-wavelength optical elements, but also to electronic devices because of their advantages of high breakdown field and high saturated electron velocity.

In particular, hetero-junction field effect transistors (referred hereinafter to as HFETs), which utilize 2-dimensional electron gas (referred hereinafter to as 2DEG) appearing at the interface between an $Al_xGa_{1-x}N$ layer (where $0 \leq x \leq 1$) and a GaN layer sequentially stacked on a semi-insulating substrate by epitaxial growth, are being developed as high-power devices or high-frequency devices. These HFETs are supplied with not only electrons from a carrier supply layer (n-type AlGaN Schottky layer) but also changes due to the polarization effect resulting from spontaneous polarization and piezo-polarization. Their electron densities are beyond $10^{13}$ cm$^{-2}$, which is about one order of magnitude greater than those of AlGaAs/GaAs-based HFETs. Thus, the HFETs using III-V nitride semiconductor can be expected to have higher drain current densities than GaAs-based HFETs, and it is reported that some of the HFETs have a maximum drain current more than 1 A/mm (see Prior Art Document 1: Yuji Ando, Yasuhiro Okamoto, Hironobu Miyamoto, Tatsuo Nakayama, Takashi Inoue, and Masaaki Kuzuhara "Characterization of High Breakdown Voltage AlGaN/GaN Heterojunction FETs with a Field Plate Gate" Technical Report of IEICE, ED2002-214, CPM2002-105 (2002-10), pp. 29-34). In addition, the III-V nitride semiconductors have wide band gaps (for example, GaN has a band gap of 3.4 eV), so that they also have high breakdown voltage characteristics. Therefore, the HFETs using the III-V nitride semiconductors can have 100 V or higher of breakdown voltage between gate and drain electrodes (see Prior Art Document 1). As mentioned above, since the HFETs using the III-V nitride semiconductors are expected to have electrical characteristics exhibiting high breakdown voltages and high current densities, consideration is being taken of application of electronic devices typified by those HFETs to high-frequency elements and elements which can handle a large amount of power even though they have smaller design sizes than conventional elements.

Although the electronic devices containing III-V nitride semiconductor are potential devices for high-frequency, high-power or large-power elements, actual fabrication of these devices requires various techniques. As one of the techniques for fabricating an element with such high-frequency, high-power or large-power-handling characteristics, a technique using a via hole structure is known.

Figure 7:
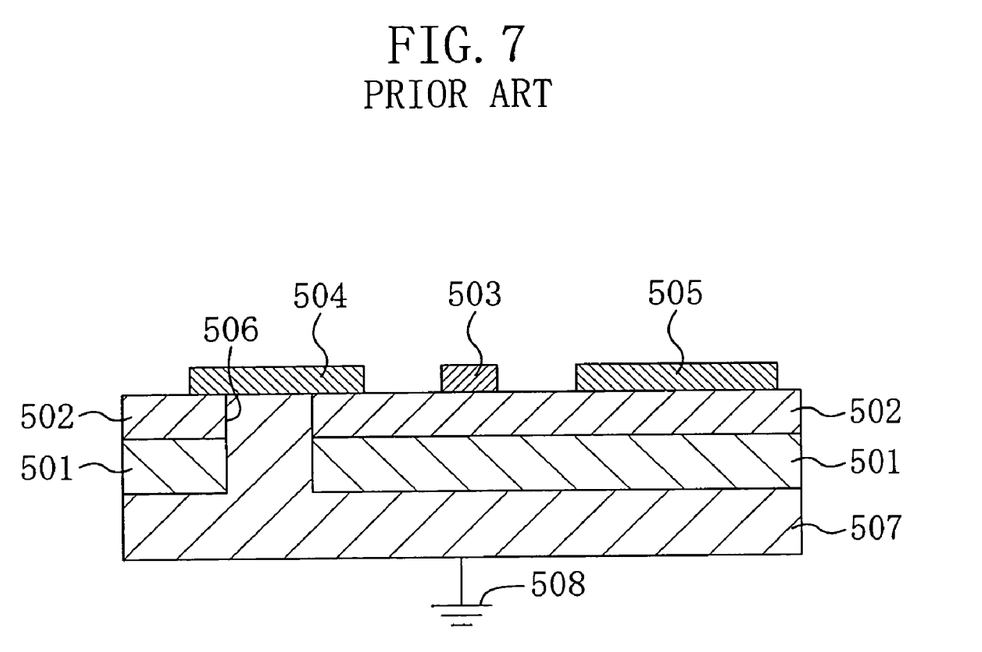
FIG. 7 is a sectional view showing the structure of a known FET with a via hole structure.

Hereinafter, an example of FETs using the known via hole structure will be described with reference to FIG. 7. FIG. 7 is a sectional view showing the structure of a known FET with the via hole structure.

Referring to FIG. 7, in the known FET, a semiconducting layer 502 including a channel layer (active layer) of n-type gallium arsenide (GaAs) is formed on a semi-insulating substrate 501 of GaAs thinned to a thickness of about 25 µm. A Schottky electrode 503 and ohmic source and drain electrodes 504 and 505 located to both sides of the Schottky electrode are formed on the semiconducting layer 502. A via hole 506 is selectively formed in portions of the semi-insulating substrate 501 and the semiconducting layer 502 located below the source electrode 504, and a backside electrode 507 is formed on a back surface of the semi-insulating substrate 501 opposite to the surface in contact with the semiconducting layer 502. The via hole 506 is also filled with the backside electrode 507 to connect the source electrode 504 to a ground electrode 508. It is reported that the FET with the source electrode 504 thus grounded through the backside electrode 507 and the via hole 506 can have a more reduced source inductance than a FET with the source electrode 504 grounded by a wire, and thereby the linear gain thereof is improved by about 2 dB (see Prior Art Document 2: Masumi Fukuda, Yasutake Hirachi "GaAs Field-Effect Transistors" The Institute of Electronics, Information and Communication Engineers, 1992, pp. 213-215).

Another example of the known FETs is a FET having a structure in which a source electrode or an emitter electrode is connected through a via hole to a p$^+$-type conductive substrate that is grounded (see Prior Art Document 3: Published Japanese Translation of PCT international publication for patent application No. 2002-536847). To fabricate this structure, the substrate made of silicon carbide (SiC) or sapphire is polished to have a small thickness, and the polished substrate is etched from the back surface thereof to form a via hole. A known method for forming this via hole is, for example, a technique disclosed in Prior Art Document 4 (Japanese Unexamined Patent Publication No. H11-45892).

The known semiconductor device using a via hole, however, has the following problems. Typically, SiC or sapphire used for a substrate of an electronic device containing III-V nitride semiconductor is very hard and highly resistant to chemical attack. Therefore, it is extremely difficult to form a via hole penetrating this substrate with the strength of the substrate maintained, that is, with the substrate not thinned. In contrary to this, if the via hole is formed after the substrate of SiC or sapphire is polished to have a small thickness, the thinned substrate becomes brittle and then may crack in the formation process of the via hole.

Moreover, in order to apply the electronic device containing III-V nitride semiconductor to a power device, the breakdown voltage between gate and drain electrodes thereof must be further enhanced.

SUMMARY OF THE INVENTION

With the foregoing in mind, an object of the present invention is to provide a semiconductor device containing III-V nitride semiconductor which can attain a high breakdown voltage and facilitate formation of a via hole.

A semiconductor device of the present invention is characterized by including: a conductive layer; a channel layer made of III-V nitride semiconductor and formed on or over the conductive layer; a Schottky layer made of III-V nitride semiconductor and formed on the channel layer; a first source electrode, a drain electrode, and a gate electrode formed on different parts of the Schottky layer, respectively; a second source electrode connected to the first source electrode; and an interconnect member connecting the first source electrode to the conductive layer through a groove penetrating the channel layer and the Schottky layer.

In this structure, the source electrodes are connected to the conductive layer through the groove, and the second source electrode is provided. Therefore, even if a high reverse voltage is applied between the gate electrode and the drain electrode, electric field concentration likely to occur at an edge of the gate electrode closer to the drain electrode can be effectively dispersed or relaxed. This improves the breakdown voltage of the device.

Moreover, it is sufficient for the interconnect member to reach the conductive layer, and thus a groove penetrating the substrate does not have to be formed. This eliminates the step of forming a groove penetrating the substrate and in addition the polishing step for thinning the substrate in order to shallow the groove. Thus, not only the groove can be formed easily, but also with the strength of the substrate maintained, electrical connection can be made between the source electrodes and the conductive layer.

The conductive layer may be a conductive substrate, and the semiconductor device may further include a buffer layer interposed between the conductive substrate and the channel layer. In this case, the lattice mismatch between the conductive layer and the channel layer and between the conductive layer and the Schottky layer can be relaxed.

Alternatively, the semiconductor device may further include: an insulator substrate or a semiconductor substrate provided below the conductive layer; and a buffer layer interposed between the substrate and the conductive layer or between the conductive layer and the channel layer. In this case, the lattice mismatch between the substrate and the conductive layer, or the lattice mismatch between the conductive layer and the channel layer and between the conductive layer and the Schottky layer can be relaxed.

The gate electrode may be provided in a region interposed between the first source electrode and the drain electrode, and the second source electrode may extend from a region above the first source electrode toward a region above the drain electrode. In this case, electric field concentration on an edge of the gate electrode closer to the drain electrode is relaxed easily, so that the breakdown voltage of the semiconductor device is improved.

Preferably, a portion of the second source electrode extending from the region above an edge of the gate electrode closer to the drain electrode toward the region above the drain electrode has a length of 20% or more of the distance between the gate electrode and the drain electrode. In this case, electric field concentration on the edge of the gate electrode closer to the drain electrode can be further relaxed.

Preferably, the gate electrode has a T-shaped cross section including: a stem in contact with the Schottky layer; and a top wider than the stem. This reduces the gate resistance, so that an excellent high-frequency characteristic can be provided.

Preferably, a metal in ohmic contact with the conductive layer is formed between the bottom surface of the groove and the interconnect member.

Preferably, the metal is formed in a single layer, a stack of layers, or an alloy containing at least one of aluminum, titanium, gold, germanium, and antimony.

A method for fabricating a semiconductor device according to the present invention is characterized by including: the step (a) of forming a channel layer and a Schottky layer, the channel layer being made of III-V nitride semiconductor and disposed on or over a conductive layer, the Schottky layer being made of III-V nitride semiconductor and disposed on the channel layer; the step (b) of forming a first source electrode, a drain electrode, and a gate electrode on different parts of the Schottky layer, respectively; the step (c) of forming a groove penetrating the channel layer and the Schottky layer to reach the top surface of the conductive layer; the step (d) of forming an interconnect member connecting the first source electrode to the conductive layer through the groove; and the step (e) of forming a second source electrode connected to the first source electrode.

With this method, the semiconductor device can be fabricated in which the source electrodes are connected to the conductive layer through the groove and the second source electrode is provided. In the fabricated semiconductor device, even if a high reverse voltage is applied between the gate electrode and the drain electrode, electric field concentration likely to occur at an edge of the gate electrode closer to the drain electrode can be effectively dispersed or relaxed. This improves the breakdown voltage of the device.

Moreover, in the step (c), it is sufficient for the groove to reach the conductive layer, and the groove does not have to penetrate the substrate. This eliminates the step of forming a groove penetrating the substrate and in addition the polishing step for thinning the substrate in order to shallow the groove. Thus, not only the groove can be formed easily, but also with the strength of the substrate maintained, electrical connection can be made between the source electrodes and the conductive layer.

Preferably, in the step (e), the second source electrode is formed which extends from a region above the first source electrode toward a region above the drain electrode. In this case, electric field concentration on an edge of the gate electrode closer to the drain electrode is relaxed easily, so that the breakdown voltage of the semiconductor device is improved.

Preferably, in the step (a), a buffer layer is further formed on the conductive layer serving as a conductive substrate, and the channel layer is formed on the buffer layer. In this case, the lattice mismatch between the conductive layer and the channel layer can be relaxed.

Preferably, in the step (a), the conductive layer is formed over or on an insulator substrate or a semiconductor substrate, and a buffer layer is interposed between the substrate and the conductive layer or between the conductive layer and the channel layer. In this case, the lattice mismatch between the substrate and the conductive layer or between the conductive layer and the channel layer can be relaxed.

The steps (d) and (e) may be carried out in the same step by patterning a single film to form the interconnect member and the second source electrode. In this case, the fabrication process of the device can be simplified.

The fabrication method may further include, after the step (c) and before the step (d), the step of forming a metal which covers the bottom surface of the groove and comes into ohmic contact with the conductive layer, and in the step (d), the interconnect member may be formed on the metal.

DETAILED DESCRIPTION OF THE PREFERRED EMBODIMENTS

Hereinafter, embodiments of the present invention will be described with reference to accompanying drawings.

First Embodiment

Figure 1:
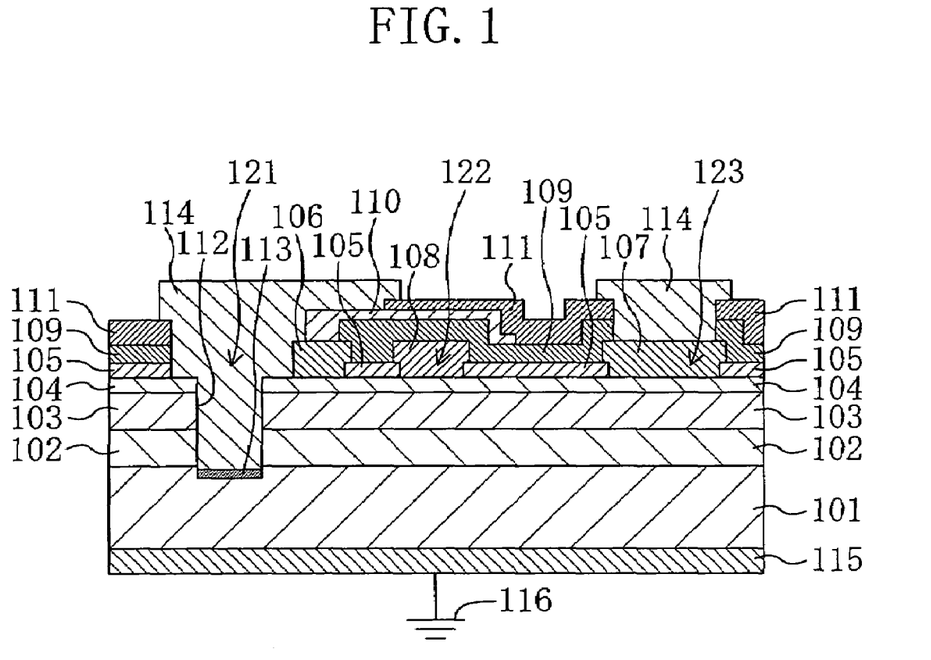
FIG. 1 is a sectional view schematically showing the structure of a hetero-junction field effect transistor (HFET) according to a first embodiment of the present invention.

FIG. 1 is a sectional view schematically showing the structure of a hetero-junction field effect transistor (HFET) according to a first embodiment of the present invention. Referring to FIG. 1, the HFET of the first embodiment includes a p$^+$-type conductive substrate 101, a buffer layer 102, a channel layer 103, and a Schottky layer 104. The p$^+$-type conductive substrate 101 is made of, for example, silicon (Si) and has a thickness of 500 μm. The buffer layer 102 with a thickness of 500 nm is made of aluminum gallium nitride ($Al_xGa_{1-x}N$ ($0 \leq x \leq 1$)) of high resistance and provided on the conductive substrate 101. The channel layer 103 with a thickness of 1000 nm is made of undoped gallium nitride (GaN) and provided on the buffer layer 102. The Schottky layer 104 with a thickness of 25 nm is made of n-type aluminum gallium nitride ($Al_yGa_{1-y}N$ ($0 \leq y \leq 1$)) and provided on the channel layer 103. The buffer layer 102 is formed to relax the lattice mismatch between the conductive substrate 101 and the channel layer 103 and between the conductive substrate 101 and the Schottky layer 104. Around the interface of the channel layer 103 forming a heterojunction with the Schottky layer 104, a channel of 2DEG is produced. In this description, the wording "high resistance" means that no current flows during normal operations of the HFET, and a so-called semi-insulating layer is also referred to as a high resistance layer.

On the Schottky layer 104, a first insulating film 105 is provided which is made of silicon nitride (SiN) and has a thickness of 100 nm. Through the first insulating film 105, openings 121, 122, and 123 are spaced away from each other. Part of the opening 121 is formed with a via hole 112. The via hole 112 is formed to penetrate the Schottky layer 104, the channel layer 103, and the buffer layer 102 and remove part of the upper portion of the conductive substrate 101. In a region of the opening 121 where the via hole 112 is not formed, a first source electrode 106 with a thickness of 200 nm is provided which also lies on the first insulating film 105. In and on the opening 122, a gate electrode 108 with a thickness of 400 nm is provided on the Schottky layer 104. In and on the opening 123, a drain electrode 107 with a thickness of 200 nm is provided on the Schottky layer 104. In this structure, the gate electrode 108 and the drain electrode 107 have T-shaped cross sections in which the upper edges thereof extend onto the first insulating film 105. The distance between the gate electrode 108 and the drain electrode 107 is greater than the distance between the gate electrode 108 and the first source electrode 106, and these electrodes form a so-called offset structure. In order to exhibit a Schottky property with the Schottky layer 104 made of n-type $Al_yGa_{1-y}N$, the gate electrode 108 is made of, for example, a stacked structure of nickel (Ni) and gold (Au). In order to exhibit an ohmic property with the Schottky layer 104, the first source electrode 106 and the drain electrode 107 are formed of, for example, a stacked structure of titanium (Ti) and aluminum (Al).

The tops of the first insulating film 105 and the gate electrode 108 are covered with a 500 nm-thick second insulating film 109 of SiN. A second source electrode 110 is formed on the first source electrode 106. The second source electrode 110 is formed to have a thickness of 100 nm, and has an eaves-like structure in which on the second insulating film 109, it extends from above the gate electrode 108 toward above the drain electrode 107. Note that the second source electrode 110 is also called a field plate electrode. In addition, a third insulating film 111 with a thickness of 400 nm is formed on the second insulating film 109 and the second source electrode 110.

On the bottom of the via hole 112, a via hole metal 113 made of, for example, aluminum (Al) is deposited to exhibit an ohmic property with the conductive substrate 101. In the via hole 112, an interconnect metal 114 is formed to cover the top of the via hole metal 113. The first source electrode 106 is electrically connected to the conductive substrate 101 through the interconnect metal 114 and the via hole metal 113. The second source electrode 110 is also in contact with the interconnect metal 114. Also in the opening 123, the interconnect metal 114 is formed to cover the top of the drain electrode 107.

On the back surface of the conductive substrate 101, a backside electrode 115 is formed which is connected to a ground electrode 116 and supplies a ground potential to the first source electrode 106. As the material for the backside electrode 115, use can be made of a stacked structure of titanium silicide (TiSi) and titanium nitride (TiN). If not silicon but silicon carbide (SiC) is used for the p$^+$-type conductive substrate 101, a stacked structure of Ti/Al can be used for the backside electrode 115.

Figure 2:
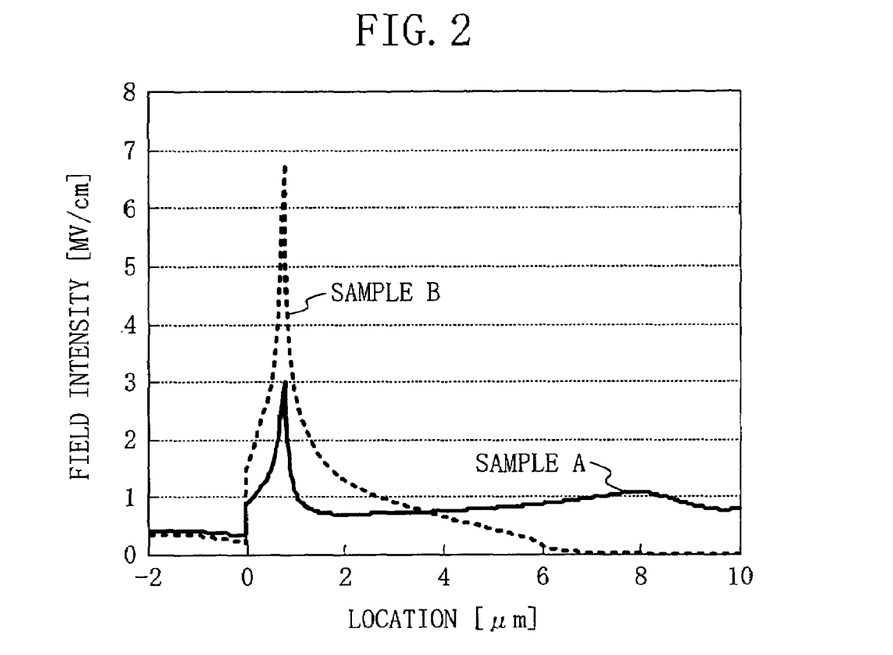
FIG. 2 is a graph showing the results of simulations of electric field distributions in channels of the FET (a sample A) of the first embodiment and a FET (a sample B) employing a substrate of high resistance and having no field plate electrode. These results are obtained in the case where in each of the samples, a source electrode and a gate electrode are grounded and a voltage of 500 V is applied to the drain electrode.

FIG. 2 is a graph showing the results of simulations of electric field distributions in channels of the FET (a sample A) of the first embodiment and a FET (a sample B) employing a substrate of high resistance and having no field plate electrode and no via hole. These results are obtained in the case where in each of the samples, the source electrode and the gate electrode are grounded and a voltage of 500 V is applied to the drain electrode. In FIG. 2, the location in the direction from the source toward the drain is plotted in abscissa (where the direction in which the value thereof increases corresponds to the direction from the source toward the drain), and the origin of the abscissa is set at the center of the gate electrode. In FIG. 2, the field intensity is plotted in ordinate. Note that in both of the samples A and B, the gate length is 1.8 μm, the distance between the source and the gate is 2 μm, and the distance between the gate and drain is 10 μm. The sample A has a field plate length (the length of the field plate electrode which extends from the edge of the gate toward the drain) of 5 μm. In FIG. 2, the buffer layer 102 ($Al_xGa_{1-x}N$) having an Al content of x=1, that is, AlN is exemplarily used, and the Schottky layer ($Al_yGa_{1-y}N$) having an Al content of y=0.26 is exemplarily used.

From the comparison between the FET (the sample A) of the first embodiment and the FET (the sample B) with no via hole and no field plate electrode, it is found that in each of the FETs, the field intensity is maximum at the edge of the gate electrode closer to the drain, and that the maximum field intensity of the FET (the sample A) of the first embodiment is half or less than half of the maximum field intensity of the sample B. This is because in the HFET of the sample B, application of a voltage to the drain concentrates electric flux lines on the gate electrode to increase the electric field of the gate edge, but in the FET of the first embodiment (the sample A), electric flux lines from the drain stream toward the field plate electrode above the gate electrode and toward the conductive substrate below the gate electrode, thereby reducing electric field concentration on the gate electrode edge. As a result, the FET of the first embodiment has an enhanced breakdown voltage.

Figure 3:
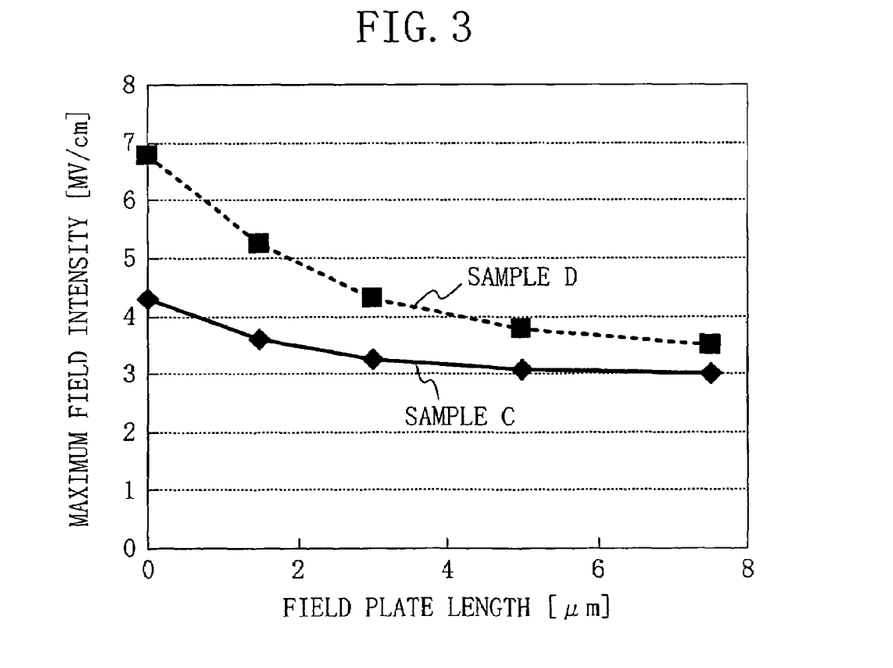
FIG. 3 is a graph regarding the FET of the first embodiment, in which the maximum field intensity relative to the field plate length is plotted.

FIG. 3 is a graph regarding the FET of the first embodiment, in which the maximum field intensity relative to the field plate length is plotted. The graph in FIG. 3 illustrates the results of measurements of two types of FETs. One type is the FET (a sample C) of the first embodiment in which the source electrode is electrically connected to the conductive substrate through the via hole, and the other is a FET (a sample D) with no via hole. In each of the samples C and D, the maximum field intensity decreases as the field plate length increases. However, the FET with the via hole (the sample C) is less dependent on the field plate length and has a smaller maximum field intensity. As shown in FIG. 3, the sample C with a field plate length of 2 μm or greater particularly has a decreased maximum field intensity, and the intensity thereof is stable. Since the distance between the gate and the drain of the sample C is 10 μm, it can be said that the FET with a field plate length of 20% or more of the distance between the gate and the drain particularly exerts a marked effect on electrical field relaxation. By employing such a structure, the maximum field intensity can be sufficiently decreased to provide a FET with a higher breakdown voltage.

In the structure of the first embodiment, the first source electrode 106 is connected to the conductive substrate 101 through the via hole 112, and the second source electrode 110 is formed. Therefore, even if a high reverse voltage is applied between the gate electrode 108 and the drain electrode 107, electric field concentration likely to occur at the edge of the gate electrode 108 closer to the drain electrode 107 can be effectively dispersed or relaxed. This improves the breakdown voltage of the device.

Moreover, since the conductive substrate 101 is used as a substrate for forming element formation layers, a via hole penetrating the substrate to reach the backside thereof does not have to be formed in the conductive substrate 101. This eliminates the step of forming a via hole in the conductive substrate 101 and in addition the polishing step for thinning the conductive substrate in order to shallow the via hole. Thus, with the strength necessary for the conductive substrate 101 maintained, the first and second source electrodes 106 and 110 can be electrically connected to the backside electrode 115 of the conductive substrate 101.

Furthermore, since $Al_xGa_{1-x}N$ of high resistance having a breakdown voltage equal to or higher than a voltage applied between the conductive substrate 101 and the carrier transport layer is used for the buffer layer 102, leakage current flowing between the conductive substrate 101 and the carrier transport layer can be reduced significantly.

In the first embodiment, the thickness of the buffer layer 102 with a high resistance and the impurity concentration of the conductive substrate 101 are desirably set so that the maximum withstand voltage of a depletion layer extending across the buffer layer 102 into the conductive substrate 101 is higher than the maximum voltage applied to the drain electrode 107. Thereby, leakage current flowing between the conductive substrate 101 and the carrier transport layer can be further lowered.

Note that in the first embodiment, the Al content x of the buffer layer 102 and the Al content y of the Schottky layer 104 are not limited to the values exemplarily shown above. As long as these contents fall within $0 \leq x \leq 1$ and $0 \leq y \leq 1$, respectively, the same effects as those obtained from the structure shown in FIGS. 2 and 3 can be exerted.

Since, as shown in FIG. 1, the gate electrode 108 has a T-shaped cross section, the HFET of the first embodiment has a small gate resistance and an excellent high-frequency characteristic. Moreover, like the field plate, the T-shaped cross section has the effect of relaxing an electric field below the top of the gate electrode, so that it is effective at enhancing the breakdown voltage of the device.

Method for Fabricating Semiconductor Device According to First Embodiment

Next, a method for fabricating a semiconductor device according to the first embodiment will be described with reference to the accompanying drawings.

FIGS. 4A to 4E are sectional views showing the method for fabricating a semiconductor device according to the first embodiment. In the method for fabricating a semiconductor device according to the first embodiment, first, in the step shown in FIG. 4A, by a metalorganic chemical vapor epitaxy method (MOVPE method), the buffer layer 102 made of $Al_xGa_{1-x}N$ ($0 \leq x \leq 1$) of high resistance, the channel layer 103 made of undoped GaN, and the Schottky layer 104 made of n-type $Al_yGa_{1-y}N$ ($0 \leq y \leq 1$) are sequentially grown on the conductive substrate 101 made of $p^+$-type Si.

Figure 4A:
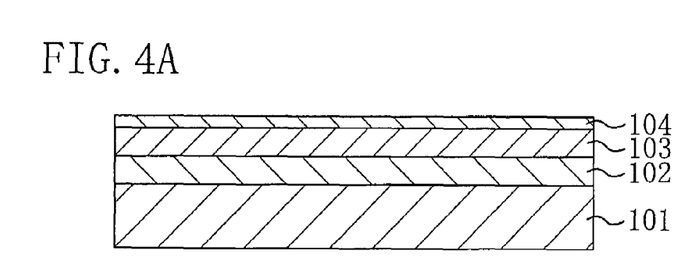
FIGS. 4A to 4E are sectional views showing a method for fabricating a semiconductor device according to the first embodiment.
Figure 4B:
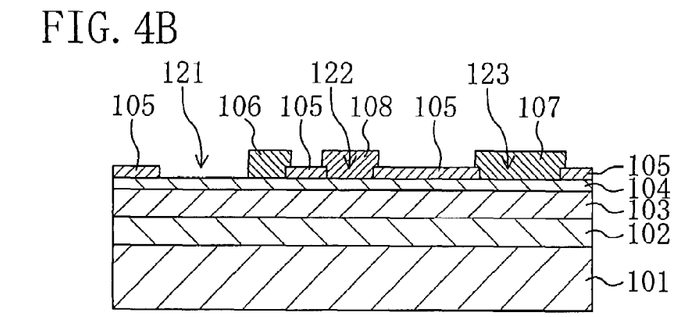

Next, in the step shown in FIG. 4B, an RIE (reactive ion etching) method with chlorine gas is carried out to form an isolation insulating film (not shown), and then the first insulating film 105 of SiN is formed by a plasma CVD (chemical vapor deposition) method. Subsequently, wet etching is performed to remove ohmic electrode formation regions of the first insulating film 105, thereby forming openings 121 and 123. Within the openings 121 and 123, the first source electrode 106 and the drain electrode 107 both of which are made of a stacked structure of Ti and Al are formed by a liftoff method, respectively, and a heat treatment at 550° C. is conducted in a hydrogen atmosphere. This heat treatment changes the first source electrode 106 and the drain electrode 107 to ohmic electrodes. Thereafter, a gate electrode formation region of the first insulating film 105 is removed by wet etching to form an opening 122. Within the opening 122, the gate electrode 108 made of a stacked structure of Ni and Au is formed by a liftoff method.

Figure 4C:
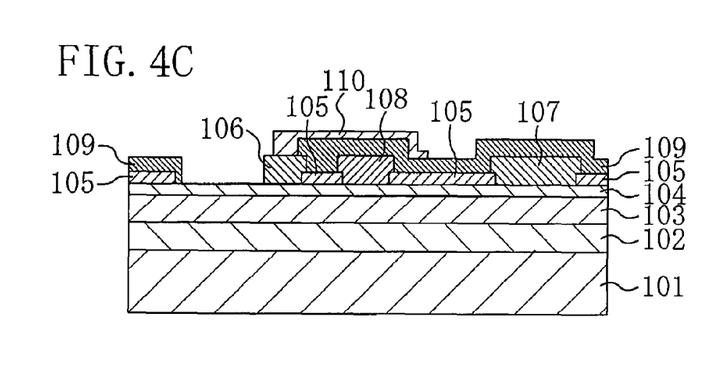

In the step shown in FIG. 4C, by a plasma CVD method, the second insulating film 109 of SiN is formed to cover the top of the substrate. Then, an RIE method with a mixed gas of carbon tetrafluoride and oxygen is conducted to remove a portion of the second insulating film 109 extending from a via hole formation region onto part of the first source electrode 106. Thereafter, by a liftoff method, the second source electrode (field plate electrode) 110 is formed which is made of a stacked structure of Ti and Au and which extends from the top of the first source electrode 106 to the top of the second insulating film 109.

Figure 4D:
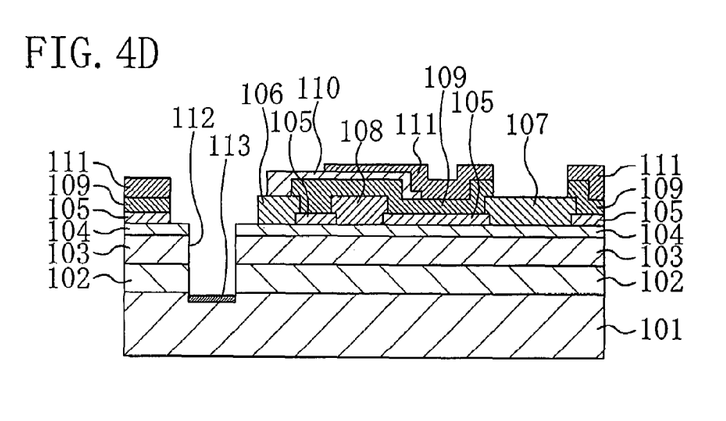

Subsequently, in the step shown in FIG. 4D, by a plasma CVD method, the third insulating film 111 of SiN is formed on the second insulating film 109 and the second source electrode 110. Thereafter, an RIE with a mixed gas of carbon tetrafluoride and oxygen is conducted to remove portions of the third insulating film 111 located on the via hole formation region, part of the first source electrode 106, and part of the second source electrode 110. In succession, an RIE with a mixed gas of carbon tetrafluoride and oxygen is conducted to remove portions of the Schottky layer 104, the channel layer 103, the buffer layer 102, and the upper part of the conductive substrate 101 which are all located in the via hole formation region, thereby forming the via hole 112. Then, by a liftoff method, the via hole metal 113 of Al is deposited on the bottom of the via hole 112.

Figure 4E:
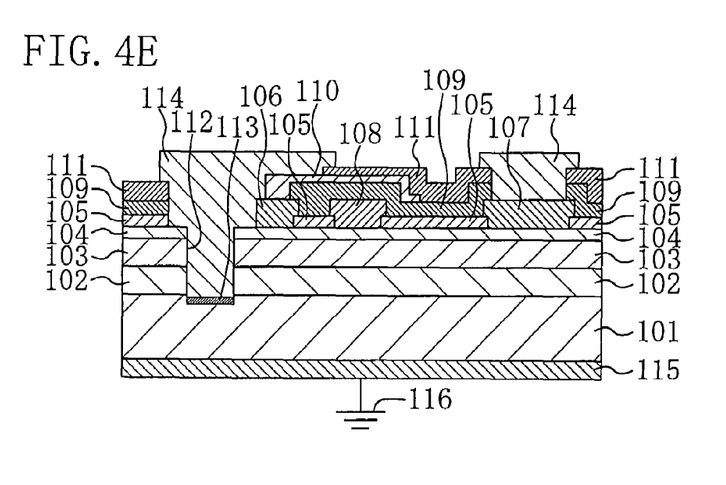

In the step shown in FIG. 4E, by an electrolytic plating method, the interconnect metal 114 of Au with a thickness of 5 µm is formed above the substrate. In this formation, the via hole 112 is filled with the interconnect metal 114, so that the interconnect metal 114 and the via hole metal 113 electrically connect the first source electrode 106 to the conductive substrate 101. Thereafter, in the step shown in FIG. 4E, by a sputtering method, the backside electrode 115 made of a stacked structure of TiSi and TiN is formed on the back surface of the conductive substrate 101.

As described above, even in all the steps of the fabrication method of the first embodiment, the first insulating film 105 covers the portions of the Schottky layer 104 located between the gate electrode 108 and the drain electrode 107 and between the gate electrode 108 and the first source electrode 106. Therefore, surface roughness of $Al_yGa_{1-y}N$ forming the Schottky layer 104 can be prevented which is caused by nitrogen dropout, and a decrease in a drain current can be prevented which is caused by current collapse.

Furthermore, since the via hole metal 113 is formed using a photoresist pattern used in the dry etching for forming the via hole 112, an additional step of forming a photoresist for forming the via hole metal is not required. Therefore, in a simple manner, a good ohmic property can be provided between the conductive substrate 101 and the interconnect metal 114.

In the fabrication method of the first embodiment, in order to improve the dimensional accuracy of the field plate length, the formation step of the field plate electrode (the second source electrode 110) and the formation step of the Au-plating interconnect (the interconnect metal 114) with a thickness of 5 µm are separately implemented. Alternatively, by forming the field plate electrode together with the interconnect metal, the formation step of the field plate electrode may be omitted. In this case, formation of the field plate, connection of the source electrode to the conductive substrate through the via hole, and formation of the interconnects are conducted simultaneously, so that the fabrication process of the device is significantly simplified.

Second Embodiment

Figure 5:
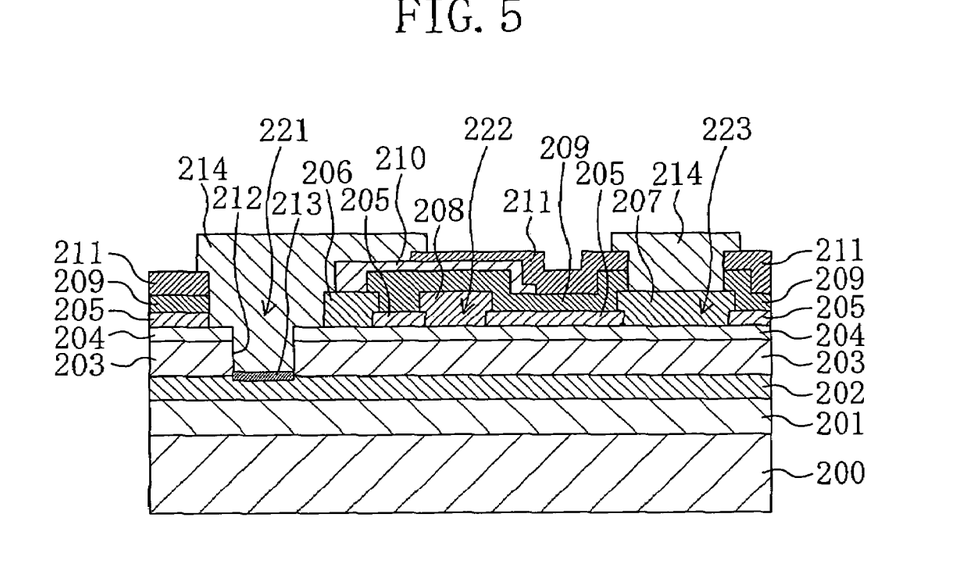
FIG. 5 is a sectional view schematically showing the structure of a semiconductor device according to a second embodiment of the present invention.

FIG. 5 is a sectional view schematically showing the structure of a semiconductor device according to a second embodiment of the present invention. Referring to FIG. 5, the HFET of the second embodiment includes an insulator substrate (or a semiconductor substrate) 200, a buffer layer 201, a conductive layer 202, a channel layer 203, and a Schottky layer 204. The insulator substrate 200 is made of, for example, sapphire and has a thickness of 500 µm. The buffer layer 201 with a thickness of 500 nm is made of aluminum gallium nitride ($Al_xGa_{1-x}N$ ($0 \leq x \leq 1$)) of high resistance and provided on the insulator substrate 200. The conductive layer 202 with a thickness of 500 nm is made of n-type gallium nitride (GaN) and provided on the buffer layer 201. The channel layer 203 with a thickness of 1000 nm is made of undoped gallium nitride (GaN) and provided on the conductive layer 202. The Schottky layer 204 with a thickness of 25 nm is made of n-type aluminum gallium nitride ($Al_yGa_{1-y}N$ ($0 \leq y \leq 1$)) and provided on the channel layer 203. In this structure, the buffer layer 201 is formed to relax the lattice mismatch between the insulator substrate 200 and the conductive layer 202, the channel layer 203, and the Schottky layer 204. Around the interface of the channel layer 203 forming a heterojunction with the Schottky layer 204, a channel of 2-dimensional electron gas (2DEG) is produced.

On the Schottky layer 204, a first insulating film 205 is provided which is made of silicon nitride (SiN) and has a thickness of 100 nm. Through the first insulating film 205, openings 221, 222, and 223 are spaced away from each other. Part of the opening 221 is formed with a via hole 212 penetrating the Schottky layer 204 to reach the channel layer 203. In a region of the opening 221 where the via hole 212 is not formed, a first source electrode 206 with a thickness of 200 nm is provided which also lies on the Schottky layer 204. In and on the opening 222, a gate electrode 208 with a thickness of 400 nm is provided on the Schottky layer 204. In and on the opening 223, a drain electrode 207 with a thickness of 200 nm is provided on the Schottky layer 204. The distance between the gate electrode 208 and the drain electrode 207 is greater than the distance between the gate electrode 208 and the first source electrode 206, and these electrodes form a so-called offset structure. In order to exhibit a Schottky property with the Schottky layer 204 made of n-type $Al_yGa_{1-y}N$, the gate electrode 208 is made of, for example, a stacked structure of nickel (Ni) and gold (Au). In order to exhibit an ohmic property with the Schottky layer 204, the first source electrode 206 and the drain electrode 207 are formed of, for example, a stacked structure of titanium (Ti) and aluminum (Al).

The top of the gate electrode 208 and part of the top of the drain electrode 207 are covered with a second insulating film 209 of SiN. A second source electrode 210 is provided on the first source electrode 206. The second source electrode (field plate electrode) 210 is formed to have a thickness of 100 nm, and has an eaves-like structure in which it protrudes astride the gate electrode 208 toward the drain electrode 207. In addition, a third insulating film 211 is formed above the gate electrode 208 and on the second source electrode 210. The second insulating film 209, the second source electrode 210, and the third insulating film 211 of the second embodiment have the same structures as those of the first embodiment, so that their description is omitted.

On the bottom of the via hole 212, a via hole metal 213 made of, for example, Ti/Al is deposited to exhibit an ohmic property with the conductive layer 202. The via hole 212 is filled with an interconnect metal 214 covering the top of the via hole metal 213. The first source electrode 206 is electrically connected to the conductive layer 202 through the interconnect metal 214 and the via hole metal 213. The second source electrode 210 is also in contact with the interconnect metal 214. Also in the opening 223, the interconnect metal 214 is formed to cover the top of the drain electrode 207.

In the second embodiment, the first source electrode 206 is connected to the conductive layer 202 through the via hole 212, and the second source electrode 210 is formed. Therefore, even if a high reverse voltage is applied between the gate electrode 208 and the drain electrode 207, electric field concentration on the edge of the gate electrode 208 closer to the drain electrode 207 can be effectively dispersed or relaxed. This improves the breakdown voltage of the device.

Moreover, since the conductive layer 202 is provided on the buffer layer 201, a via hole penetrating the insulator substrate 200 does not have to be formed. This eliminates the step of forming a via hole in the insulator substrate 200 and in addition the polishing step for thinning the insulator substrate 200 in order to shallow the via hole. Thus, with the strength necessary for the insulator substrate 200 maintained, the first and second source electrodes 206 and 210 can be electrically connected to the conductive layer 202.

Modification of Second Embodiment

Figure 6:
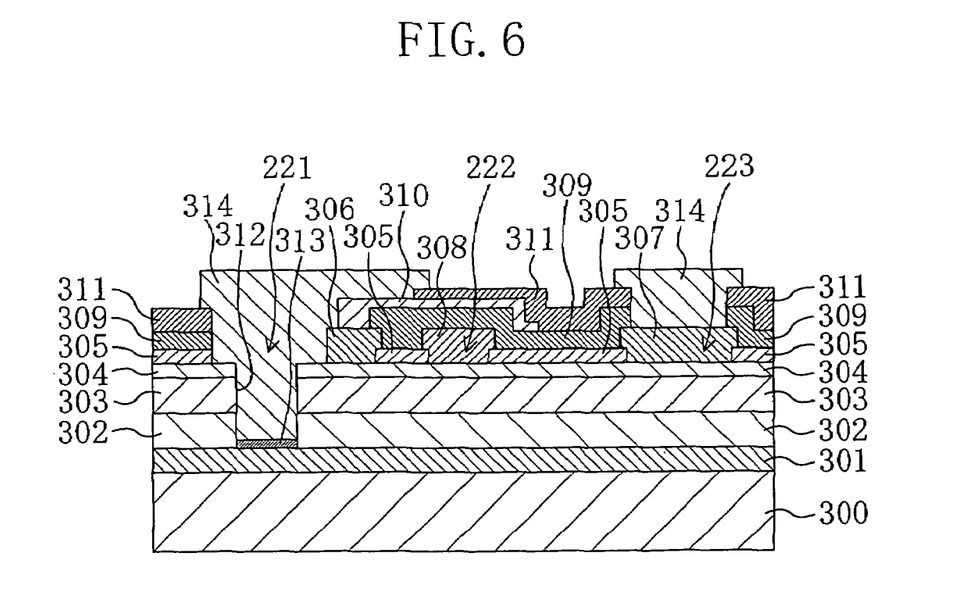
FIG. 6 is a sectional view schematically showing the structure of a semiconductor device according to a modification of the second embodiment.

FIG. 6 is a sectional view schematically showing the structure of a semiconductor device according to a modification of the second embodiment. Referring to FIG. 6, the HFET of this modification includes a semiconductor substrate (or an insulator substrate) 300, a conductive layer 301, a buffer layer 302, a channel layer 303, and a Schottky layer 304. The semiconductor substrate 300 is made of, for example, Si and has a thickness of 500 μm. The 500 nm-thick conductive layer 301 of a low resistance (the resistivity is 0.01 Ωcm or lower) is made of n-type doped Si and provided on the semiconductor substrate 300. The 500 nm-thick buffer layer 302 of a high resistance is made of aluminum gallium nitride ($Al_xGa_{1-x}N$ ($0 \leq x \leq 1$)) and provided on the conductive layer 301. The channel layer 303 is made of undoped gallium nitride (GaN) and provided on the buffer layer 302. The Schottky layer 304 with a thickness of 25 nm is made of n-type aluminum gallium nitride ($Al_yGa_{1-y}N$, where $0 \leq y \leq 1$) and provided on the channel layer 303. In this structure, the buffer layer 302 is formed to relax the lattice mismatch between the semiconductor substrate 300 and the channel layer 303 and between the semiconductor substrate 300 and the Schottky layer 304. Around the interface of the channel layer 303 forming a heterojunction with the Schottky layer 304, a channel of 2DEG is produced.

On the Schottky layer 304, a first insulating film 305 is provided which is made of silicon nitride (SiN) and has a thickness of 100 nm. Through the first insulating film 305, openings 321, 322, and 323 are spaced away from each other. Part of the opening 321 is formed with a via hole 312 penetrating the Schottky layer 304, the channel layer 303, and the buffer layer 302 to reach the conductive layer 301. In a region of the opening 321 where the via hole 312 is not formed, a first source electrode 306 with a thickness of 200 nm is provided which also lies on the Schottky layer 304. In and on the opening 322, a gate electrode 308 with a thickness of 400 nm is provided on the Schottky layer 304. In and on the opening 323, a drain electrode 307 with a thickness of 200 nm is provided on the Schottky layer 304.

The top of the gate electrode 308 and part of the top of the drain electrode 307 are covered with a second insulating film 309 of SiN. The second source electrode (field plate electrode) 310 connected to the first source electrode 306 has an eaves-like structure in which it protrudes astride the gate electrode 308 toward the drain electrode 307. In addition, a third insulating film 311 is formed above the gate electrode 308 and on the second source electrode 310. The second insulating film 309, the second source electrode 310, and the third insulating film 311 of this modification have the same structures as those of the first embodiment, so that their description is omitted.

On the bottom of the via hole 312, a via hole metal 313 made of, for example, Al is deposited to exhibit an ohmic property with the conductive layer 301. The via hole 312 is filled with an interconnect metal 314 covering the top of the via hole metal 313. The first source electrode 306 is electrically connected to the conductive layer 301 through the interconnect metal 314 and the via hole metal 313. The second source electrode 310 is also in contact with the interconnect metal 314. Also in the opening 323, the interconnect metal 314 is formed to cover the top of the drain electrode 307.

Also in this modification, the first source electrode 306 is connected to the conductive layer 301 through the via hole 312, and the second source electrode 310 is formed. Therefore, even if a high reverse voltage is applied between the gate electrode 308 and the drain electrode 307, electric field concentration on the edge of the gate electrode 308 closer to the drain electrode 307 can be effectively dispersed or relaxed. This improves the breakdown voltage of the device.

Moreover, since the conductive layer 301 is provided below the buffer layer 302, a via hole penetrating the semiconductor substrate 300 does not have to be formed. This eliminates the step of forming a via hole in the semiconductor substrate 300 and in addition the polishing step for thinning the semiconductor substrate 300 in order to shallow the via hole. Thus, with the strength necessary for the semiconductor substrate 300 maintained, the first and second source electrodes 306 and 310 can be electrically connected to the conductive layer 301.

In this modification of the second embodiment, exemplary description has been made of the case where an n-type doped Si layer is formed as the conductive layer 301. However, it is also acceptable to use a p-type doped Si layer (the resistivity is 0.01 Ωcm or lower) thereas.

Method for Fabricating Semiconductor Device according to Second Embodiment

Next, of a method for fabricating a semiconductor device according to the second embodiment and its modification, different steps from those of the first embodiment will be described with reference to FIGS. 5 and 6 again.

In the method for fabricating a semiconductor device according to the second embodiment, as shown in FIG. 5, by a MOVPE method, the buffer layer 201 made of $Al_xGa_{1-x}N$ ($0 \leq x \leq 1$) of high resistance, the conductive layer 202 made of an n-type GaN layer formed by Si doping, the channel layer 203 made of undoped GaN, and the Schottky layer 204 made of n-type $Al_yGa_{1-y}N$ ($0 \leq y \leq 1$) are sequentially grown on the insulator substrate 200. Portions of the Schottky layer 204 and the channel layer 203 are removed by an RIE method with chlorine gas to form the via hole 212. By a liftoff method, the via hole metal 213 of Ti/Al in ohmic contact with the conductive layer 202 is deposited on the bottom of the via hole 212. Other fabrication steps are the same as those described in the first embodiment, so that their description is omitted.

On the other hand, in the method for fabricating a semiconductor device according to this modification, as shown in FIG. 6, the n-type or p-type conductive layer 301 of a low resistance doped with P, As, B, or the like by thermal diffusion or ion implantation is formed on the semiconductor substrate 300. On the formed conductive layer 301, the buffer layer 302 made of $Al_xGa_{1-x}N$ ($0 \leq x \leq 1$) of a high resistance, the channel layer 303 made of undoped GaN, and the Schottky layer 304 made of n-type $Al_yGa_{1-y}N$ ($0 \leq y \leq 1$) are sequentially grown by a MOVPE method. Portions of the Schottky layer 304, the channel layer 303, and the buffer layer 302 are removed by an RIE method with chlorine gas to form the via hole 312. By a liftoff method, the via hole metal 313 of Al in ohmic contact with the conductive layer 301 is deposited on the bottom of the via hole 312. Other fabrication steps are the same as those described in the first embodiment, so that their description is omitted.

In the first and second embodiments, even if other than Al or Ti/Al, a single layer, a stack of layers, or an alloy made of at least one of titanium, gold, germanium, and antimony is used for the via hole metal 113, 213, and 313, the same effects can be provided.

What is claimed is:

1. A semiconductor device comprising:
   a conductive layer;
   a channel layer made of III-V nitride semiconductor and formed on or over the conductive layer;
   a Schottky layer made of III-V nitride semiconductor and formed on the channel layer;
   a first source electrode, a drain electrode, and a gate electrode formed on different parts of the Schottky layer, respectively;
   a second source electrode connected to the first source electrode; and
   an interconnect member connecting the first source electrode to the conductive layer through a groove penetrating the channel layer and the Schottky layer.

2. The device of claim 1,
   wherein the conductive layer is a conductive substrate, and
   the device further comprises a buffer layer interposed between the conductive substrate and the channel layer.

3. The device of claim 1, further comprising:
   an insulator substrate or a semiconductor substrate provided below the conductive layer; and
   a buffer layer interposed between the substrate and the conductive layer or between the conductive layer and the channel layer.

4. The device of claim 1,
   wherein the gate electrode is provided in a region interposed between the first source electrode and the drain electrode, and
   the second source electrode extends from a region above the first source electrode toward a region above the drain electrode.

5. The device of claim 4,
   wherein a portion of the second source electrode extending from the region above an edge of the gate electrode closer to the drain toward the region above the drain electrode has a length of 20% or more of the distance between the gate electrode and the drain electrode.

6. The device of claim 1,
   wherein the gate electrode has a T-shaped cross section including: a stem in contact with the Schottky layer; and a top wider than the stem.

7. The device of claim 1,
   wherein a metal in ohmic contact with the conductive layer is formed between the bottom surface of the groove and the interconnect member.

8. The device of claim 7,
   wherein the metal is formed in a single layer, a stack of layers, or an alloy containing at least one of aluminum, titanium, gold, germanium, and antimony.

9. The device of claim 7,
   wherein the Schottky layer is made of a material different from the conductive layer,
   the metal is made of a material different from the first source electrode, and
   the first source electrode is in ohmic contact with the Schottky layer.

10. The device of claim 9, wherein the metal is made of the same material as the interconnect member.

11. The device of claim 9, wherein the first source electrode is made of a material different from the interconnect member.

12. The device of claim 11, wherein the second source electrode is made of a material different from the interconnect member.

13. The device of claim 4, wherein the first source electrode is made of a material different from the second source electrode.

14. The device of claim 9, wherein the first source electrode is not formed directly above the groove.

* * * * *